(12) United States Patent
Taussig et al.

(10) Patent No.: US 7,202,179 B2
(45) Date of Patent: Apr. 10, 2007

(54) METHOD OF FORMING AT LEAST ONE THIN FILM DEVICE

(75) Inventors: Carl P. Taussig, Redwood City, CA (US); Ping Mei, Palo Alto, CA (US); Han-Jun Kim, Sunnyvale, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 110 days.

(21) Appl. No.: 11/025,750

(22) Filed: Dec. 22, 2004

(65) Prior Publication Data
US 2006/0134922 A1    Jun. 22, 2006

(51) Int. Cl.
*H01L 21/302* (2006.01)
*H01L 21/461* (2006.01)

(52) U.S. Cl. .............. 438/739; 438/618; 257/208

(58) Field of Classification Search .......... 438/618, 438/622, 739; 257/208, 723, 773
See application file for complete search history.

(56) References Cited

U.S. PATENT DOCUMENTS

| 5,346,850 | A  | * | 9/1994 | Kaschmitter et al. | ....... 438/487 |
| 6,613,243 | B2 | * | 9/2003 | Ricks | ............ 216/66 |
| 6,808,646 | B1 |   | 10/2004 | Jeans |  |
| 2003/0140317 | A1 | * | 7/2003 | Brewer et al. | ............... 716/1 |
| 2004/0002216 | A1 |   | 1/2004 | Taussig et al. |  |
| 2004/0217085 | A1 |   | 11/2004 | Jeans |  |

* cited by examiner

*Primary Examiner*—Phuc T. Dang

(57) ABSTRACT

This invention provides a method of forming at least one thin film device, such as for example a thin film transistor. The method includes providing a substrate and depositing a plurality of thin film device layers upon the substrate. An imprinted 3D template structure is provided upon the plurality of thin film device layers. The plurality of thin film layers and 3D template structure are etched and at least one thin film layer is undercut.

43 Claims, 13 Drawing Sheets

METHOD OF FORMING AT LEAST ONE THIN FILM DEVICE

FIELD OF THE INVENTION

The present invention relates generally to the field of forming semiconductor devices, and in particular to an improved method of making at least one thin film device.

BACKGROUND

Socially and professionally, most people rely upon video displays in one form or another for at least a portion of their work and/or recreation. With a growing demand for large screens and high definition television (HDTV), cathode ray tubes (CRT's) have largely given way to displays composed of liquid crystal devices (LCDs), light-emitting diodes (LEDs), plasma and front and rear projection systems.

A CRT operates by a scanning electron beam exciting phosphorous-based materials on the back side of a transparent screen, wherein the intensity of each pixel is commonly tied to the intensity of the electron beam. With an LED and plasma display, each pixel is an individual light-emitting device capable of generating its own light. With an LCD display, each pixel is a transient light-emitting device, individually adjusted to permit light to shine through, or reflect through the pixel by altering the polarization of the transmitted or reflected light.

As LCD, plasma and LED screens do not utilize a large tube, as in a CRT, LCD, plasma and LED screens may be quite thin and in many cases are lighter than comparable CRT displays. As such large and small flat screen displays can be provided to improve the portability of laptop computers, video displays in vehicles and airplanes, and information displays that are mounted or set in eye catching locations.

Typically incorporated into the screens of such flat screen devices as LCD, plasma and LED displays are a plurality of thin film devices, such as transistors. Specifically, one or more transistors are commonly used to control the behavior of each pixel within the display. The individual nature of each pixel of a LED, plasma or LCD display introduces the possibility that each pixel may not provide the same quantity of light. One pixel may be brighter or darker than another, a difference that may be quite apparent to the viewer.

As a flat screen display may incorporate hundreds of thousands of transistors, great care is generally applied in the fabrication of LED, plasma and LCD displays in an attempt to ensure that the pixels (and more specifically the backplane transistors controlling the pixels) are as uniform and consistently alike as is possible. Frequently, especially with large displays, quality control measures discard a high percentage of displays before they are fully assembled. As such, displays are generally more expensive than they otherwise might be, as the manufacturers must recoup the costs for resources, time and precise tooling for the acceptable displays as well as the unacceptable displays.

Traditionally, thin film devices have been formed through processes such as photolithography. In a photolithographic process, a substrate is provided and at least one material layer is uniformly deposited upon the substrate. A photoresist layer, also commonly known simply as a photoresist, or even resist, is deposited upon the material layer, typically by a spin coating machine. A mask is then placed over the photo resist and light, typically ultra-violet (UV) light, is applied. During the process of exposure, the photoresist undergoes a chemical reaction. Generally the photoresist will react in one of two ways.

With a positive photoresist, UV light changes the chemical structure of the photoresist so that it is soluble in a developer. What "shows" therefore goes, and the mask provides an exact copy of the patterns which are to remain—such as, for example the trace lines of a circuit.

A negative photoresist behaves in the opposite manner—the UV exposure causes it to polymerize and not dissolve in the presence of a developer. As such the mask is a photographic negative of the pattern to be left. Following the developing with either a negative or positive photoresist, blocks of photoresist remain. These blocks may be used to protect portions of the original material layer, serve as isolators or other components.

Very commonly, these blocks serve as templates during an etching process, wherein the exposed portions of the material layer are removed, such as for example, to establish a plurality of conductive rows.

The process may be repeated several times to provide the desired thin film devices. As such, new material layers are set down on layers that have undergone processing. Such processing may inadvertently leave surface defects in the prior layers as well as unintended contaminant particles.

The crystalline texture of the materials composing each material layer, and specifically the crystalline texture of each material at an interface between materials is often of significant importance to the operation of the thin film device. Surface defects and surface contaminants may negatively affect the interfaces between layers and possibly degrade the performance of the thin film device.

In addition, photolithography is a precise process applied to small substrates. In part this is due to the high cost of the photo masks. For the fabrication of larger devices, typically rather than employing a larger and even more costly photo mask, a smaller mask is repeatedly used—a process that requires precise alignment.

As a photolithographic process typically involves multiple applications of materials, repeated masking and etching, issues of alignment between the thin film layers is of high importance. A photolithographic process is not well suited for formation of thin film devices on flexible substrates, where expansion, contraction or compression of the substrate may result in significant misalignment between material layers, thereby leading to inoperable thin film devices. In addition a flexible substrate is not flat—it is difficult to hold flat during the imprinting process and thickness and surface roughness typically can not be controlled as well as they can for glass or other non-flexible substrates.

The issue of flatness in photolithography can be problem because the minimum feature size that can be produced by a given imaging system is proportional to the wavelength of the illumination divided by the numerical aperture of the imaging system. However the depth of field of the imaging system is proportional to the wavelength of the illumination divided by the square of the numerical aperture. Therefore as resolution is increased the flatness of the substrate quickly becomes the critical issue.

With respect to the flat screen displays introduced above, use of flexible substrates for the internal backplane controlling the pixels is often desired. Such a flexible substrate can provide a display with flexible characteristics. A flexible substrate may also be easier to handle during fabrication and provide a more mechanically robust display for the user.

Hence, there is a need for a process to provide at least one thin film device that overcomes one or more of the drawbacks identified above.

SUMMARY

The present disclosure advances the art by providing a method of forming at least one thin film device.

In particular and by way of example only, according to an embodiment of the present invention, a method of forming at least one thin film device including: providing a substrate; depositing a plurality of thin film device layers upon the substrate; providing an imprinted 3D template structure upon the plurality of thin film device layers; etching the plurality of thin film device layers and 3D template structure; and undercutting at least one thin film device layer.

DETAILED DESCRIPTION

Figure 1:
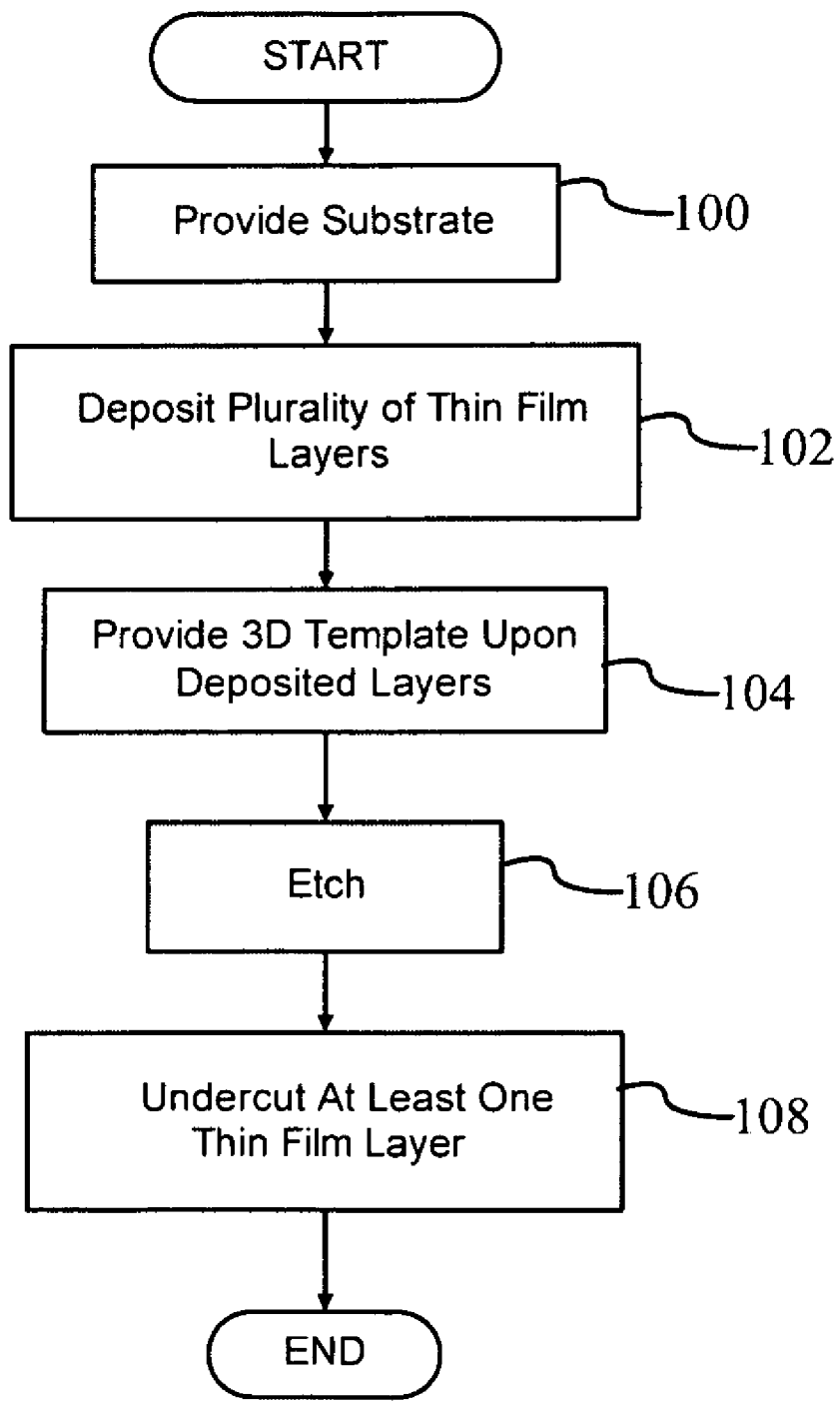
FIG. 1 is a high level flowchart of at least one method embodiment.

Before proceeding with the detailed description, it is to be appreciated that the present teaching is by way of example, not by limitation. Thus, although the instrumentalities described herein are for the convenience of explanation shown and described with respect to exemplary embodiments, it will be appreciated that the principles herein may be equally applied in other types of thin film devices ("TFDs").

In at least one embodiment, the method for forming at least one thin film device incorporates Self-Aligned Imprint Lithography ("SAIL"), a recently developed technique for producing multilayer patterns on flexible substrates. The basics of this process are set forth and described in U.S. patent application Ser. No. 10/104,567, U.S. Patent Publication No. 04-0002216, the disclosure of which is incorporated herein by reference.

The SAIL technique uses a 3D patterned resist and is typically employed in roll-to-roll processing. As the 3D resist is flexible, the pattern will stretch or distort to the same degree as the substrate. As such, a SAIL roll-to-roll fabrication process may be employed to provide low cost manufacturing solutions for devices such as flat and/or flexible displays, or other devices suitable for roll-to-roll processing. It shall also be realized that the disclosed method may be employed upon a non-flexible substrate while remaining within the spirit and scope of at least one embodiment.

Referring now to the drawings, FIG. 1 through FIG. 13 conceptually illustrate at least one embodiment of a method of forming at least one TFD. It will be appreciated that the described process need not be performed in the order in which it is herein described, but that this description is merely exemplary of one preferred method of fabricating at least one TFD. In addition, it is understood and appreciated that the scale of the components and features illustrated in the Figures has been exaggerated to facilitate ease of discussion.

FIG. 1 is a high level flowchart of a method for forming at least one TFD. As indicated in block 100, the processes are generally commenced by providing a flexible substrate. A plurality of thin film device layers are then deposited upon the substrate, block 102. An imprinted 3D template structure, such as an imprinted polymer, is then provided upon the plurality of thin film device layers, block 104.

The plurality of thin film device layers and the 3D template structure are then etched, block 106. This etching forms the rudimentary structure for a TFD. The rudimentary structure is transformed into at least one TFD by undercutting at least one thin film device layer, block 108. As is further explained below, it is to be appreciated that under the present method, a planarizing material is not employed. More specifically, all thin film device layers are advantageously deposited before etching is performed, and subsequent planarization steps and the deposition of further material layers are not required to achieve a TFD.

Figure 2:
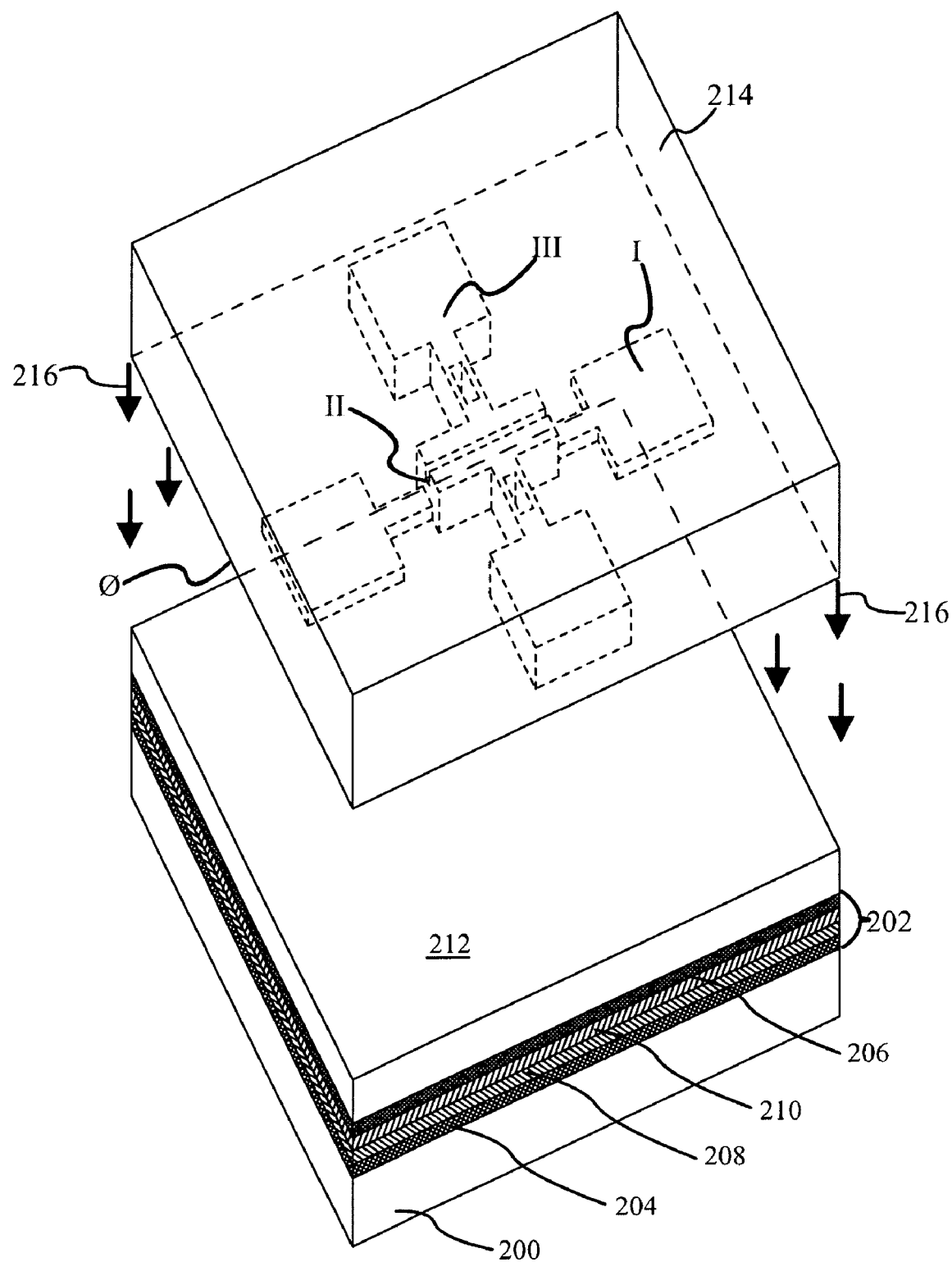
FIG. 2 is a perspective view of a substrate with a plurality of thin film layers and polymer set to receive a stamping template in accordance with an embodiment.

Turning to FIG. 2, provided is a more detailed illustration of the initial processes described above. Specifically there is shown a portion of a substrate 200. Typically, the substrate 200 is chemically cleaned to remove any particulate matter, organic, ionic, and or metallic impurities or debris which may be present upon the surface of the substrate 200. A plurality of thin film layers 202 are deposited upon the substrate 200 as a stack, the stack having a top layer and a bottom layer.

In at least one embodiment the thin film device layers, herein after thin film layers 202, include a first metal layer 204 and a second metal layer 206 with at least one material layer therebetween. As shown, the first metal layer 204 is the bottom layer and the second metal layer 206 is the top layer. As will be further explained below, the composition of the first metal layer 204 is different from the composition of the second metal layer 206. For the formation of a TFD such as a transistor, and for the purposes of discussion herein, the illustrated layers between first metal layer 204 and second metal layer 206 are a gate dielectric 208 and a channel semiconductor 210.

With respect to transistors, there are two types—bottom-gate transistors and top gate transistors. Bottom-gate transistors incorporating amorphous silicon are generally more desirable then top gate amorphous silicon transistors. This is due in part to better device performance in terms of a higher electron field effect mobility and a lower off-state leakage current. For purposes of discussion, the fabrication of a bottom-gate thin film transistor (TFT) will be used as an example. It is, of course, understood and appreciated that the undercutting method herein described is not limited to the fabrication of bottom-gate TFT's, but may be employed in a variety of different fabrication settings.

In at least one embodiment substrate 200 is a flexible substrate, such as for example a polyimide plastic sheet with or without an inorganic coating. In at least one alternative embodiment, substrate 200 is transparent. Further substrate 200 may be both transparent and flexible. In addition, in at least one embodiment, the plurality of thin film layers 202 is a stack of Aluminum, Silicon Nitride, Amorphous Silicon, N+ doped microcrystalline or amorphous Silicon, and Titanium. In an alternative embodiment, the plurality of thin film layers 202 is a stack of Titanium, Alumina, Zinc Oxide, and Aluminum. In yet another alternative embodiment, such as where the TFD is a cross over, the thin film layers 202 may include, but are not limited to, a first metal, a second metal and therebetween, a fuse layer, an anti-fuse layer, or a stacked ferromagnetic data layer/a dielectric/reference layer.

Deposition of the thin film layers 202 may be done by vacuum deposition, gravure coating, or such other method as is appropriate for the material being deposited, and or the TFD being formed. As each of the thin film layers 202 is deposited directly upon the other and without intervening processing steps, such as but not limited to masking, etching, and planarizing, the interfaces between each of the thin film layers 202 may be of high quality.

Typically, when one material layer is deposited upon another the morphology surface roughness and surface chemistry of the base layer will affect the development of the structure within the deposited layer. The propagation of a desirable thin film structure is often desired to establish high quality interfaces, and ultimately the operational characteristics of the TFD. The deposition of all thin film layers 202 prior to further processing may advantageously permit the formation of TFDs with highly uniform and/or superior operational properties.

To provide a template for forming at least one TFD, it is desirable to have a 3D template structure over the stacked thin film layers 202. In at least one embodiment, a polymer 212, such as an imprint polymer or imprint resist, is deposited upon the stacked thin film layers 202 and imprinted by a stamping tool 214. The resist or polymer 212 may comprise any of a variety of commercially available polymers. For example, a polymer from the Norland optical adhesives (NOA) family of polymers could be used. A silicone material may also be used as is described in patent application Ser. No. 10/641,213 entitled "A Silicone Elastomer Material for High-Resolution Lithography" which is herein incorporated by reference.

A method for utilizing a stamping tool to generate a 3D Structure in a layer of material is described in patent application Ser. No. 10/184,587 entitled "A Method and System for Forming a Semiconductor Device" which is herein incorporated by reference. A stamping tool is further described in patent application Ser. No. 10/903,300 entitled "Imprint Stamp" which is herein incorporated by reference. With further respect to roll-to-roll processing where substrate 200 may be of arbitrary size, yet another method for providing a 3D Structure is described in U.S. Pat. No. 6,808,646 entitled "Method of Replicating a High Resolution Three-Dimension Imprint Pattern on a Compliant Media of Arbitrary Size" which is also herein incorporated by reference.

For the formation of a TFD such as a transistor, stamping tool 214 as shown has an imprinting pattern with four (4) different vertical elevations—the first, elevation 0 corresponding to the base of the stamping tool 214, and elevations I, II, and III extending inwardly from elevation 0.

As illustrated by arrows 216, stamping tool 214 is brought into intimate contact with polymer 212 with sufficient force to imprint polymer 212 and establish a 3D template structure. In at least one embodiment, capillary forces are used to draw the imprint polymer 212 into the stamping tool 214, thus permitting very low contact pressure. Stamping tool 214 may be translucent such that the stamped polymer may be hardened or otherwise cured, such as by UV light, to retain the 3D template structure. In at least one embodiment, stamping tool 214 may be an embossing roller such as is suitable for use in roll-to-roll processing.

Figure 3:
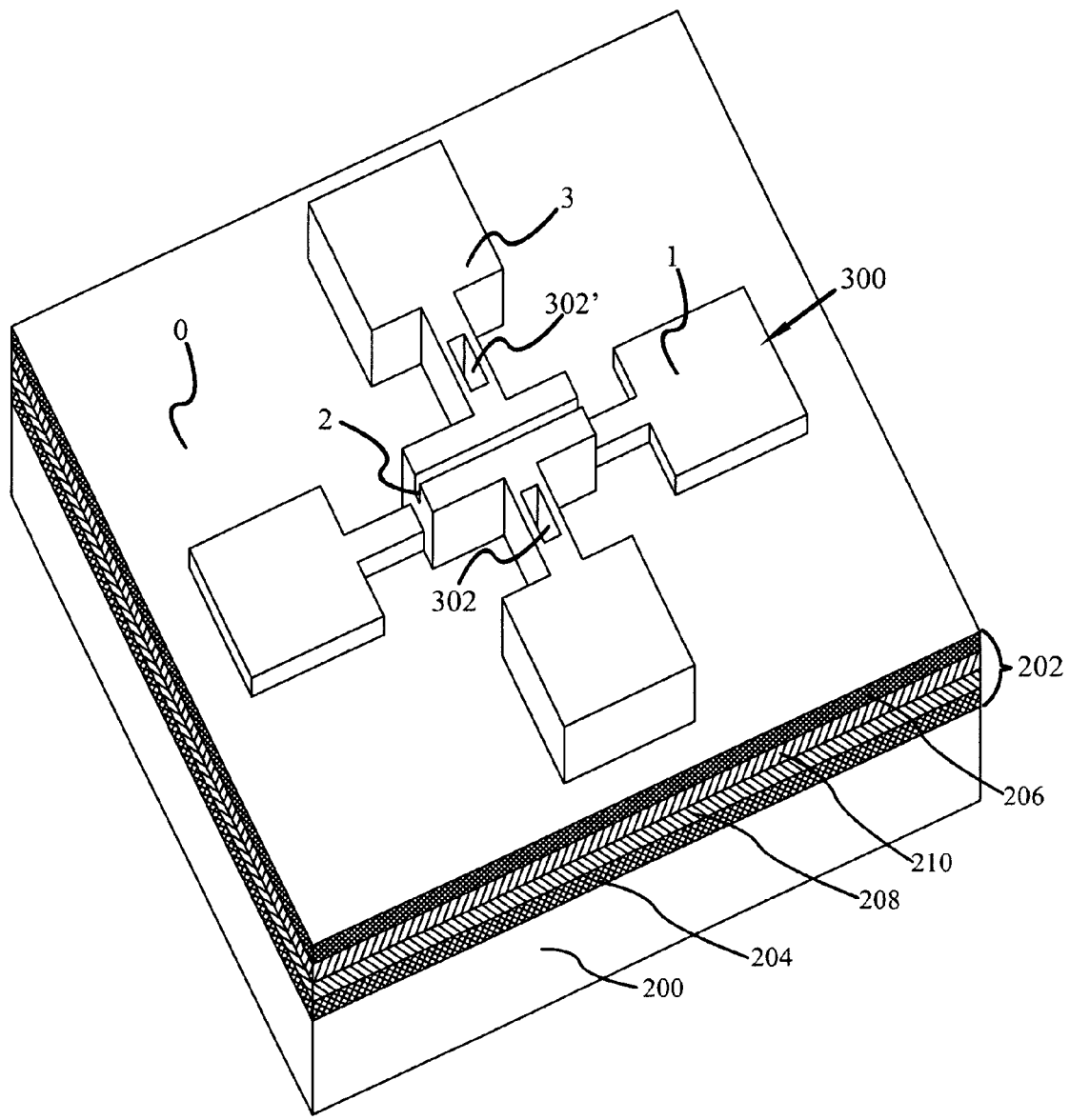
FIG. 3 is a perspective view of the formed 3D polymer template in accordance with an embodiment.

FIG. 3 illustrates the resulting 3D template structure 300. 3D template structure 300 has plurality of different levels, also know as vertical heights. Ideally, after the imprinting process there is no polymer material in areas corresponding to stamping tool 214 elevation 0, however due to squeeze film effects, a thin residual film of polymer may be present. This thin residual film is generally on the order of 100 nm. As indicated above, the scale in the illustrations has been exaggerated.

As shown, each of the thin film layers 202 is substantially the same thickness, an arbitrary one unit. In actuality, each layer may vary in thickness as may be required for the desired TFD. In addition, although the 3D template structure 300 is shown to be three arbitrary units high, the step heights in an actual polymer mask are about ten times the thickness of the thin film layers, i.e. 1 μ versus 0.1 μ.

This residual film represents 3D template structure 300 mask level 0. 3D template structure 300 mask level 1 covers the region of thin film layers 202 that will ultimately form gate contacts. 3D template structure 300 mask level 2 covers the region of thin film layers 202 that will ultimately form the channel region. 3D template structure 300 mask level 3 covers the region of thin film layers 202 that will ultimately form the source and drain contacts.

In at least one embodiment, the polymer material present at mask level 0 is of substantially no consequence, rather the material providing levels 1, 2 and 3 are the primary vertical heights used to template the formation of a transistor TFD. The difference in heights between each of the primary vertical heights (1, 2, and 3) is on the order of 1 It and may be different for different levels.

In a properly functioning transistor, capacitive coupling between the gate metal and the source and drain metal is minimized. 3D template structure 300 provides at least one feature 302 that is used to promote this isolation.

Figure 4:
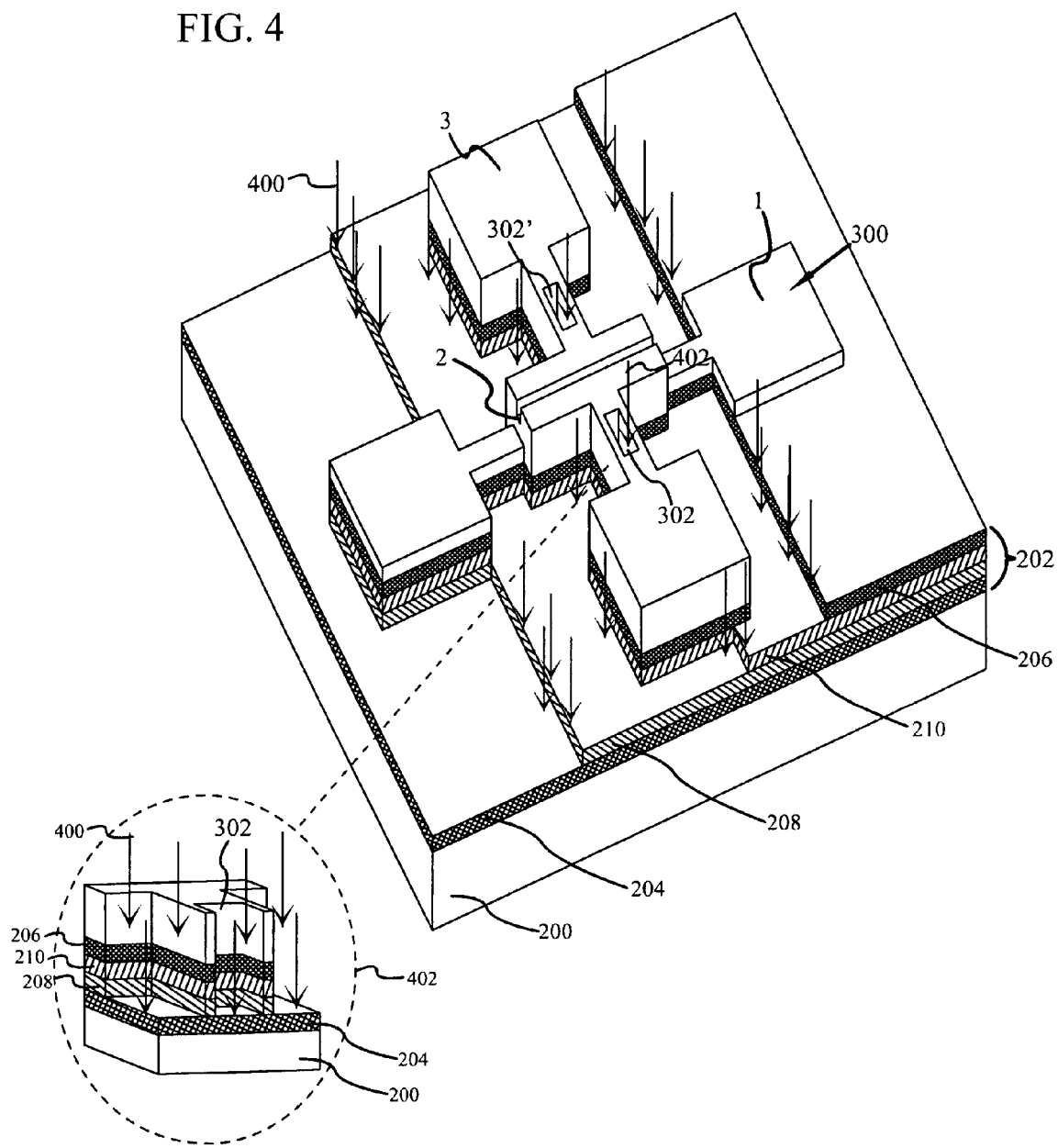
FIG. 4. is a perspective view of structure in FIG. 3 undergoing etching in accordance with an embodiment.

Continuing with the example of forming at least one transistor TFD, FIG. 4 illustrates the process of etching, specifically ion etching. This etching process may involve a series of etches, first to remove any residual polymer at level 0, then second metal layer 206, semiconductor 210, and dielectric 208. Preferably, in at least one embodiment these etches are substantially anisotropic, as illustrated by arrows 400 being substantially perpendicular to substrate 200. Features 302 in 3D template structure 300 permit the etching process to be performed on specifically localized sections of the thin film layers 202 that are otherwise covered by 3D template structure As may be more fully appreciated in partial enlarged cutaway bounded by dotted oval 402, the anisotropic etching 400 removes material from thin film layers 202 so as to create a hollow below feature 302.

These etches are mutually selective. Further, it is understood that generally a layer is completely removed before etching on the layer beneath is commenced. The condensed stair step depiction of removal shown in FIG. 4 is intended as a composite image demonstrating multiple etching steps.

Figure 5:
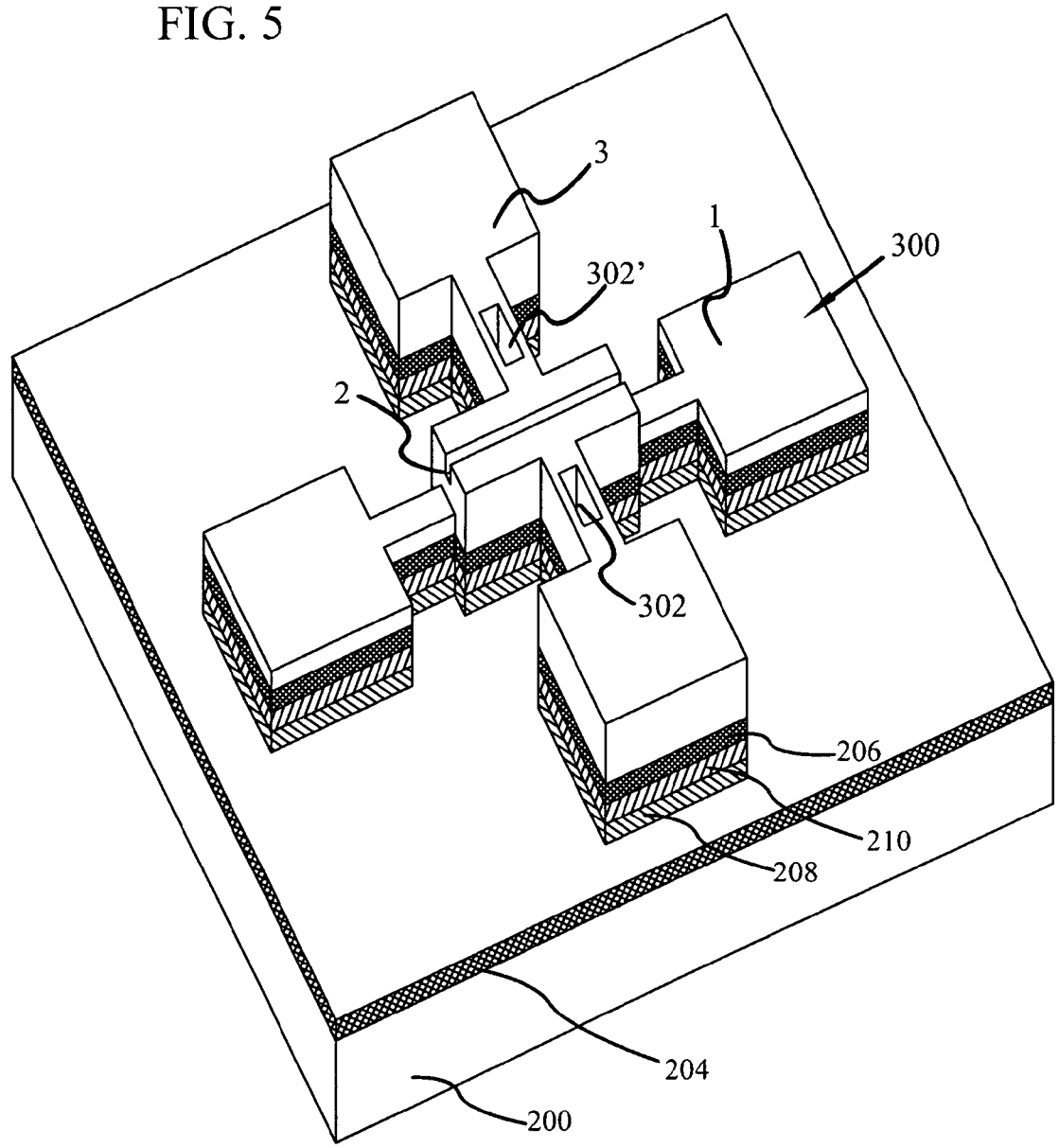
FIG. 5. is a perspective view of the structure in FIG. 4 having been etched to down to the bottom thin film layer in accordance with an embodiment.

FIG. 5 illustrates the status of the forming TFD with the unmasked portions of the second metal 206, semiconductor 210, and dielectric 208 layers removed. As shown by arrows 402 (FIG. 4), the etching process is applied through features 302 of 3D template structure 300 as well.

It is generally understood that an ion etching process may be accomplished by either of two traditional processes—a physical process or an assisted physical process. In a physical etching environment, no chemical agent is provided. Rather, the removal of material is entirely dependent upon the physical impact of the ions knocking atoms off the material surface by physical force alone. Physical ion etching is commonly referred to as ion milling or ion beam etching. Physical ion etching is also typically referred to as a dry process. A physical etching process is typically very anisotropic.

In an assisted physical process such as a reactive ion etching process, or RIE, removal of material comes as a combined result of chemical reactions and physical impact. Generally, the ions are accelerated by a voltage applied in a vacuum. The effect of their impact is aided by the introduction of a chemical which reacts with the surface being etched. In other words the reaction attacks and removes the exposed surface layers of the material being etched.

An RIE process advantageously permits very accurate etching of the one or more layers with little appreciable affect upon other layers. In other words, specific selection of different materials permits an RIE process to soften one layer without significantly softening another. In at least one embodiment, the removal or etching of the plurality of thin film layers 202 is accomplished with RIE. Although ion etching and RIE have been described in conjunction with at least one embodiment, it is understood and appreciated that one of ordinary skill in the art will recognize that a variety of different etch processes could be utilized without departing from the scope and spirit herein disclosed.

Figure 6:
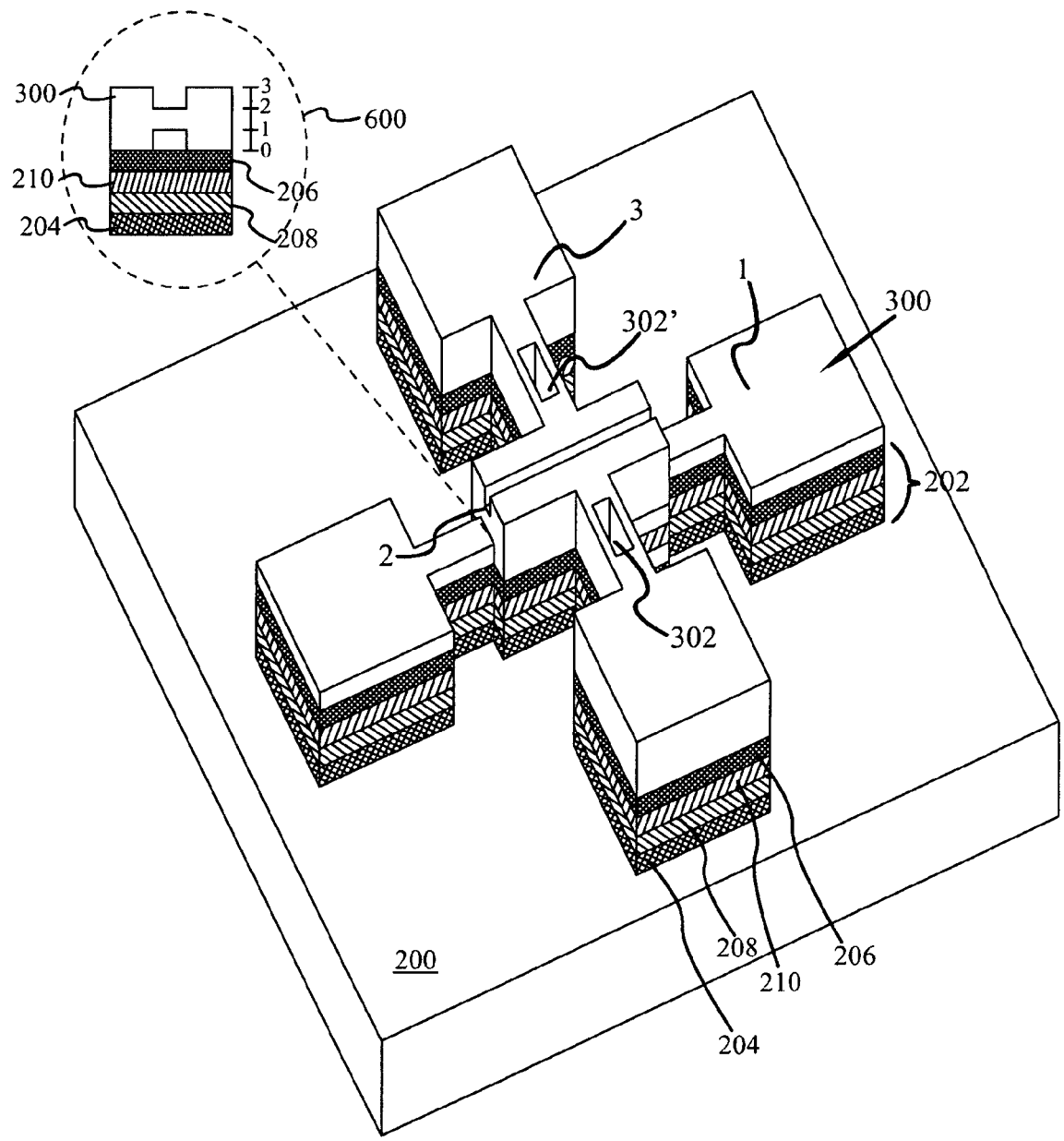
FIG. 6 is a perspective view of the structure in FIG. 5 with the bottom thin film layer having been etched and undercut in accordance with an embodiment.
Figure 7:
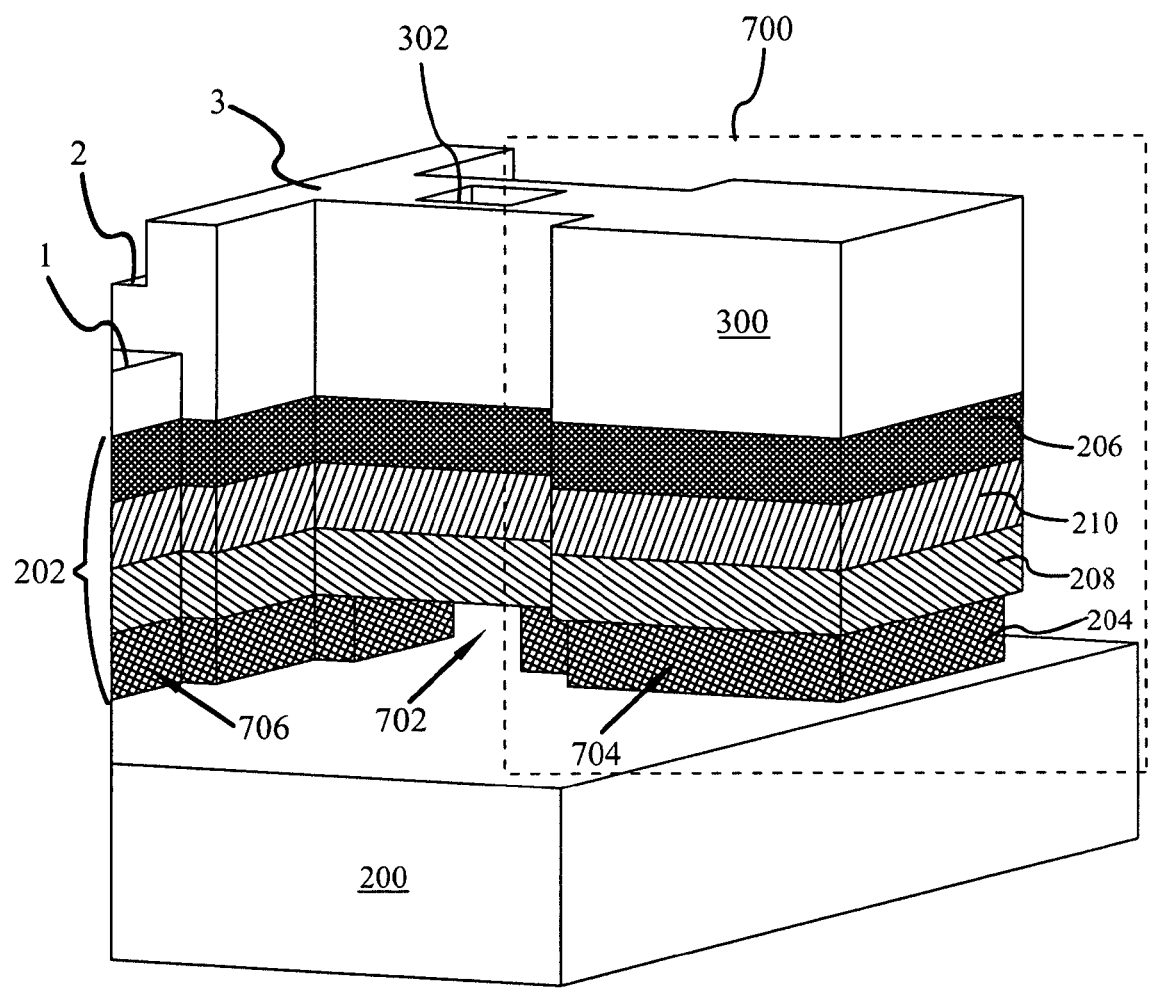
FIG. 7 is an enlarged partial view of FIG. 6 showing the undercut providing a plurality of simply connected regions in the bottom layer in accordance with an embodiment.
Figure 8:
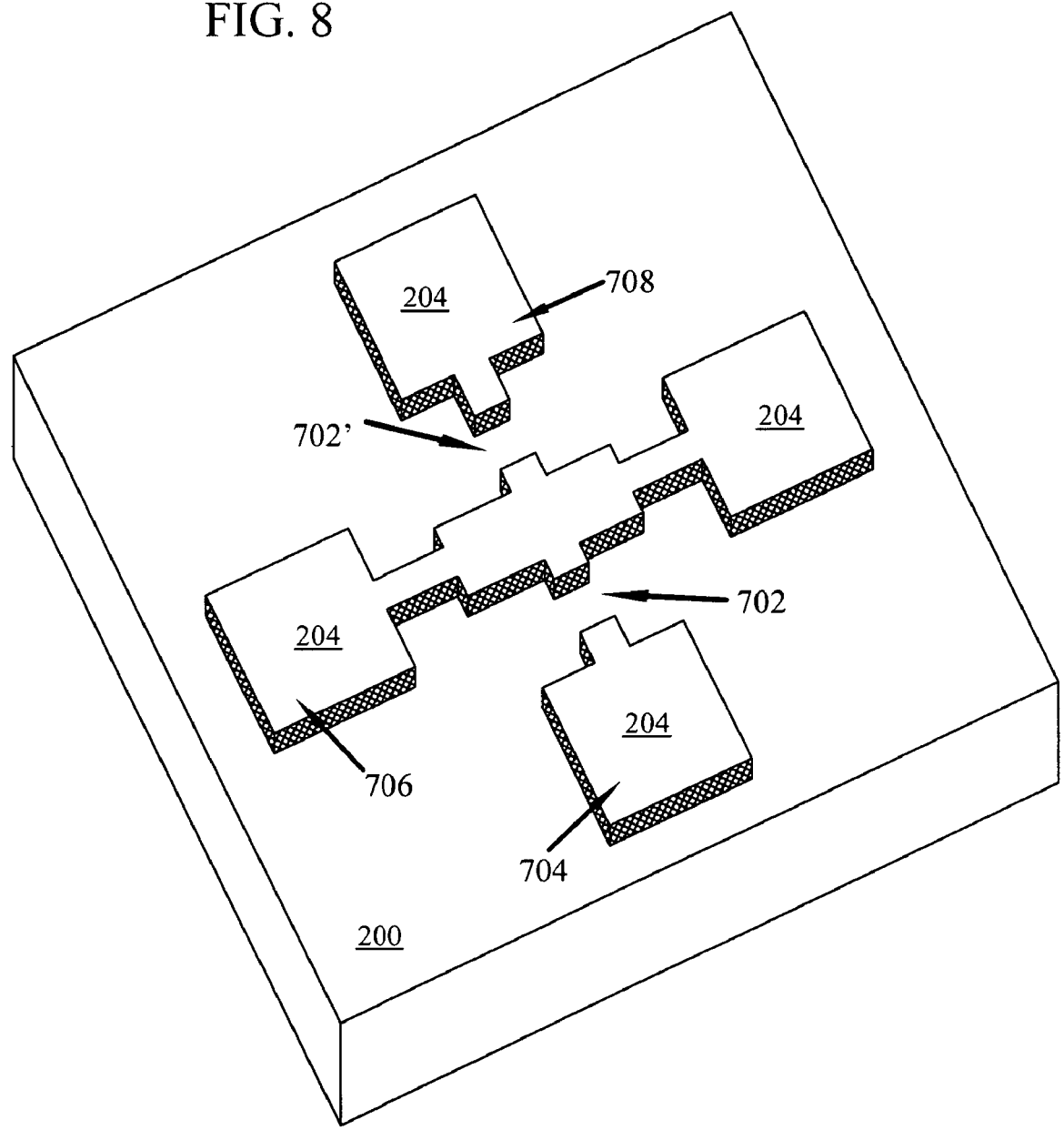
FIG. 8 is a perspective view showing only the bottom thin film layer of the structure in FIG. 6 showing the plurality of simply connected regions in accordance with an embodiment.
Figure 9:
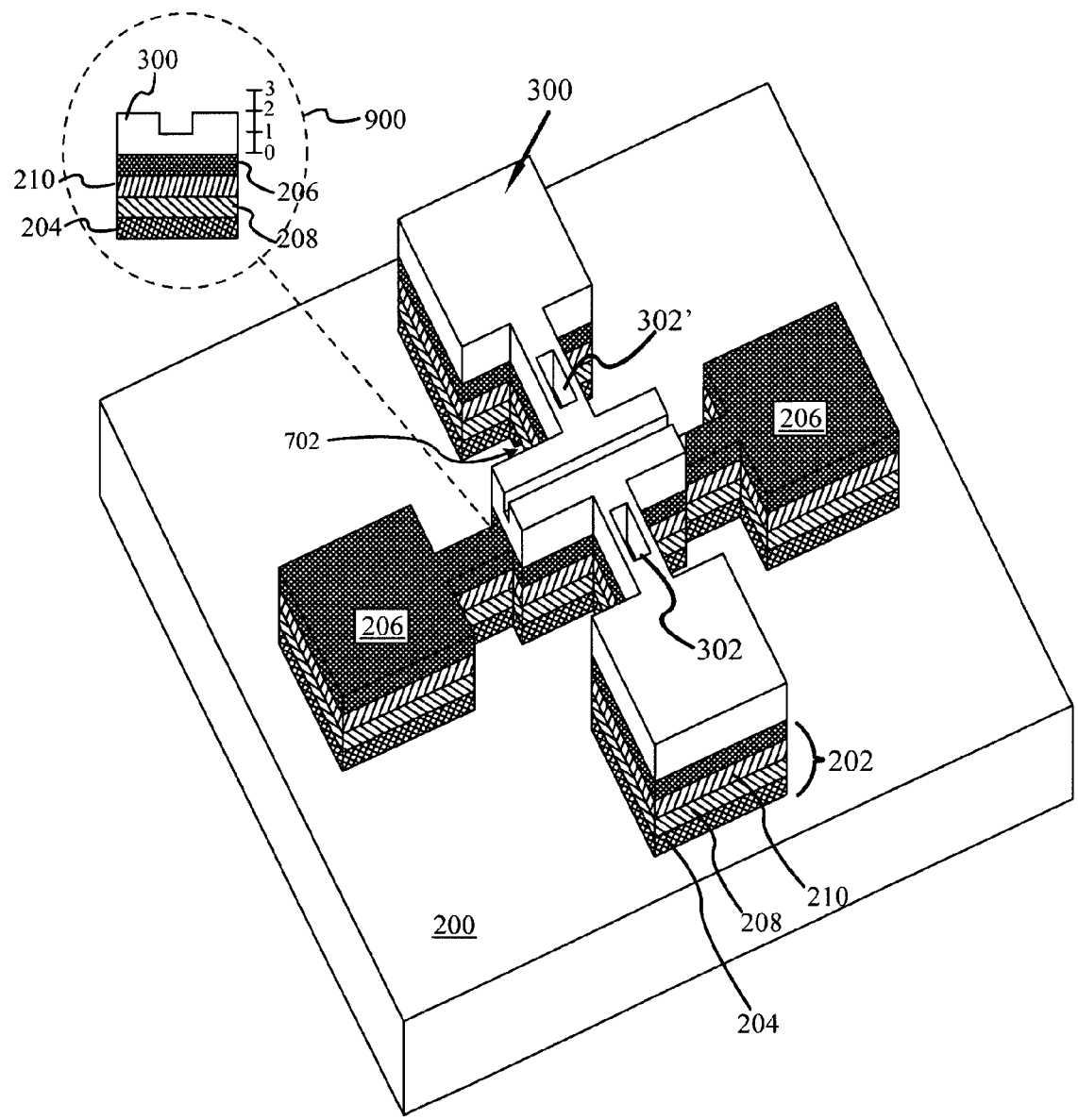
FIG. 9 is a perspective view of the structure in FIG. 6 with the 3D template having been etched to remove the thinnest layer and expose a portion of the top thin film layer in accordance with an embodiment.

FIGS. 6, 7 and 8 are provided to further illustrate the etching and undercutting process performed upon at least one thin film device layer. This undercutting provides at least one bridged island 700, see FIG. 7. More specifically, as shown in FIGS. 7 and 8, in at least one embodiment, it is first metal layer 204 that is undercut.

It is undercutting that permits the creation of crossovers between first metal layer 204 and second metal layer 206. In the case of a transistor TFD, the undercutting process also allows the source/drain to gate capacitance to be minimized thereby enabling high speed operation of the transistor and minimizing the feed through voltage that can degrade the performance of display applications.

To accomplish the undercutting, the etchant is preferably highly selective to the material of the thin film layer being undercut. It is for this reason that the composition of the first metal layer 204 is selected to be different from the composition of the second metal layer 206. It is also important that the etch process is isotropic since lateral etching of the film to be undercut is desired. Wet or dry isotropic etches can be used.

In at least one embodiment, the first metal layer 204 comprises chrome and the second metal layer 206 comprises aluminum. By utilizing an etchant that is highly selective to first metal layer 204 and not second metal layer 206, first metal layer 204 may be undercut without significant degradation to second metal layer 206, or the other thin film layers.

As shown in FIG. 6 the etching process is continued upon the bottom layer, shown as first metal layer 204, to expose the substrate 200. A cross section view bounded by dotted line 600 illustrates the side view of the center structure and further illustrates the respective height levels (0, 1, 2, 3) of 3D template structure 300. The etching process is further continued to undercut the first metal layer 204 and provide at least one bridged island 700 by achieving cut through 702, see FIG. 7. Specifically, and with respect to FIG. 8, the undercutting achieves cut throughs 702 to provide a plurality of simply connected regions 704, 706, 708.

A simply connected region is generally considered a closed polygon, however it should be understood and appreciated that, in certain embodiment, one or more simply connected regions may be donut shaped. More specifically, each simply connected region may have one or more apertures, depressions, or protrusions—as may be desired for the eventual TFD device. It is clearly appreciated in FIG. 8 that simply connected regions 704 and 706 are physically separated from simply connected region 708.

With respect to FIG. 6 and as shown in the detail of FIG. 7, the simply connected regions 704, 706, 708 of first metal layer 204 are adjacent to a single simply connected region in a different thin film device layer. Specifically in the example embodiment illustrated, dielectric 208 has not been undercut, and therefore provides a single simply connected region adjacent to the plurality of simply connected regions 704, 706, 708 now provided in first metal layer 204.

The single simply connected region of the dielectric 208, as well as that of semiconductor 210 and second metal layer 206 bridge between the plurality of simply connected regions now provided in first metal layer 204. As such, and as more clearly shown in FIG. 7, the undercutting process providing cut through 702 provides at least one bridged island 700.

It is of course realized that for the undercutting process to be effective there is preferably a significant difference in width between the width of the first metal layer 204 lines in the area desired to be etched through and the narrowest first metal layer 204 lines in the area desired to remain continuous. 3D template structure 300 and feature 302 define these areas. Further, feature 302 provides the etchant to the first metal layer 204 in the specific area desired for undercutting.

A reasonable width to be cut through in first metal layer 204 with the undercutting process is about 1~2 microns, i.e. 0.5~1 micron from each side. The minimum feature width for features to remain in first metal layer 204 should be at least 4~6 microns. This undercutting process advantageously permits the plurality of thin film layers 202 that were initially deposited in succession without intervening masking, etching, or other reforming processes to now provide at least one cross over. Further, it shall also be noted that for a bottom gate TFT, initial deposit of thin film layers 202 does not restrict the minimum channel length of the device. Channel length is an important factor in determining TFT performance. Minimum channel length is only limited by imprint resolution. The imprinting process described above advantageously permits the fabrication of channel lengths less than one micron.

Although the undercutting process has been described in this example to provide simply connected regions, it will be understood and appreciated by those skilled in the art that the undercutting process may also be employed to provide a released structure. Such a released structure may be desired in a TFD such as an accelerometer or other microelectromechanical system device, commonly referred to as MEMS.

In at least one embodiment, following the undercutting process, the imprinted 3D template structure 300 is etched to expose the thin films beneath the thinnest remaining portion of the imprinted mask, level 1 In other words the 3D template structure 300 is etched to lower the overall height sufficient to remove the lowest vertical height. This etch exposes at least a portion of the stacked thin film layers 202, shown in FIG. 9. The remaining portions of 3D template structure 300 have also been reduced. As may be more clearly appreciated in the cross section view bounded by dotted line 900, level 2 is now one unit high and level 3 is now two units high.

Figure 10:
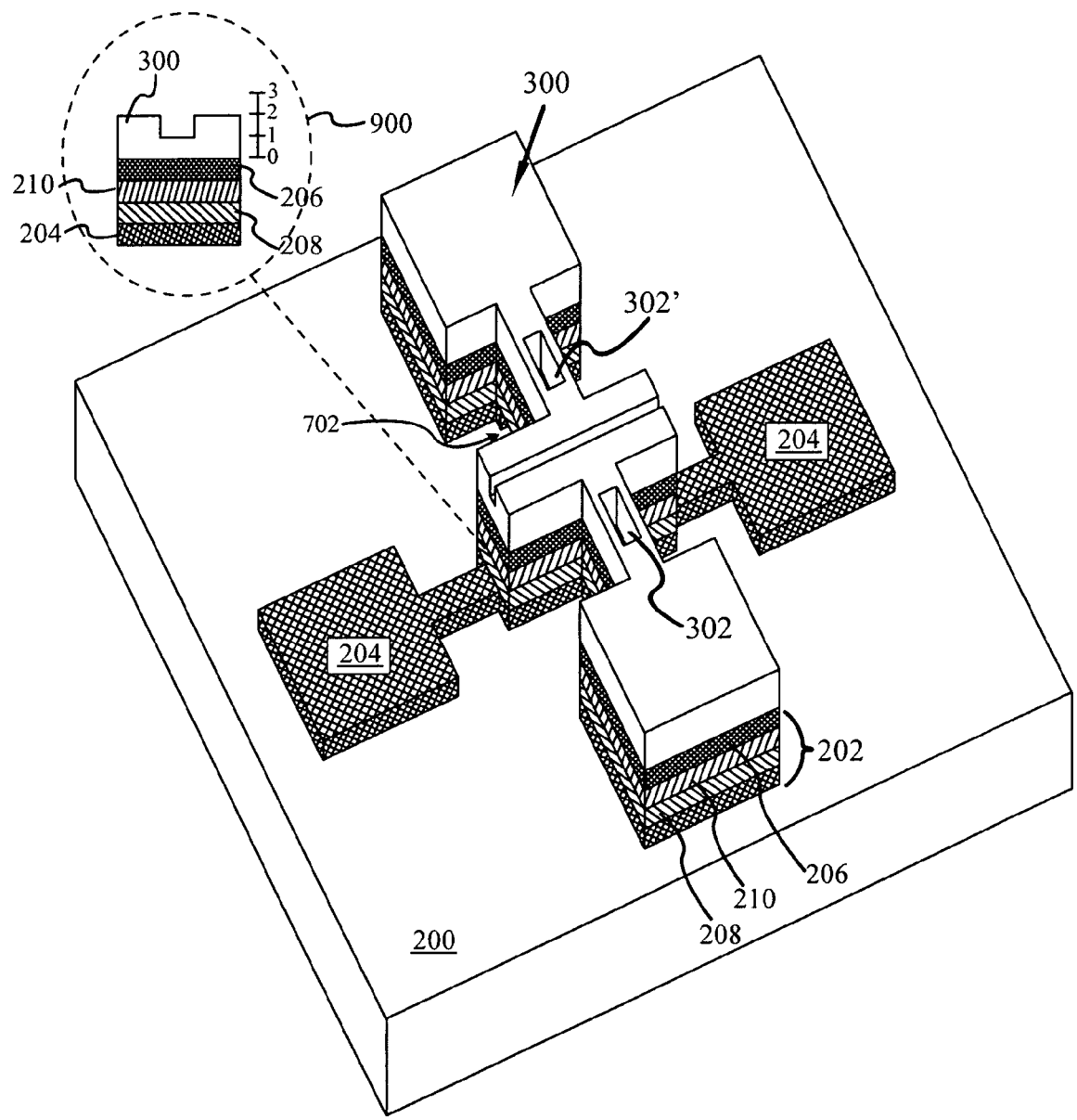
FIG. 10 is a perspective view of the structure in FIG. 9 with the exposed portions of the thin film layers etched to expose the bottom thin film layer in accordance with an embodiment.

Etching is now performed upon the exposed portions of the stacked thin film layers 202 to expose first metal layer 204. In at least one embodiment this etching is performed with highly selective etchants. In addition the etching process is anisotropic. The resulting structure with exposed first metal layer 204 is shown in FIG. 10.

Figure 11:
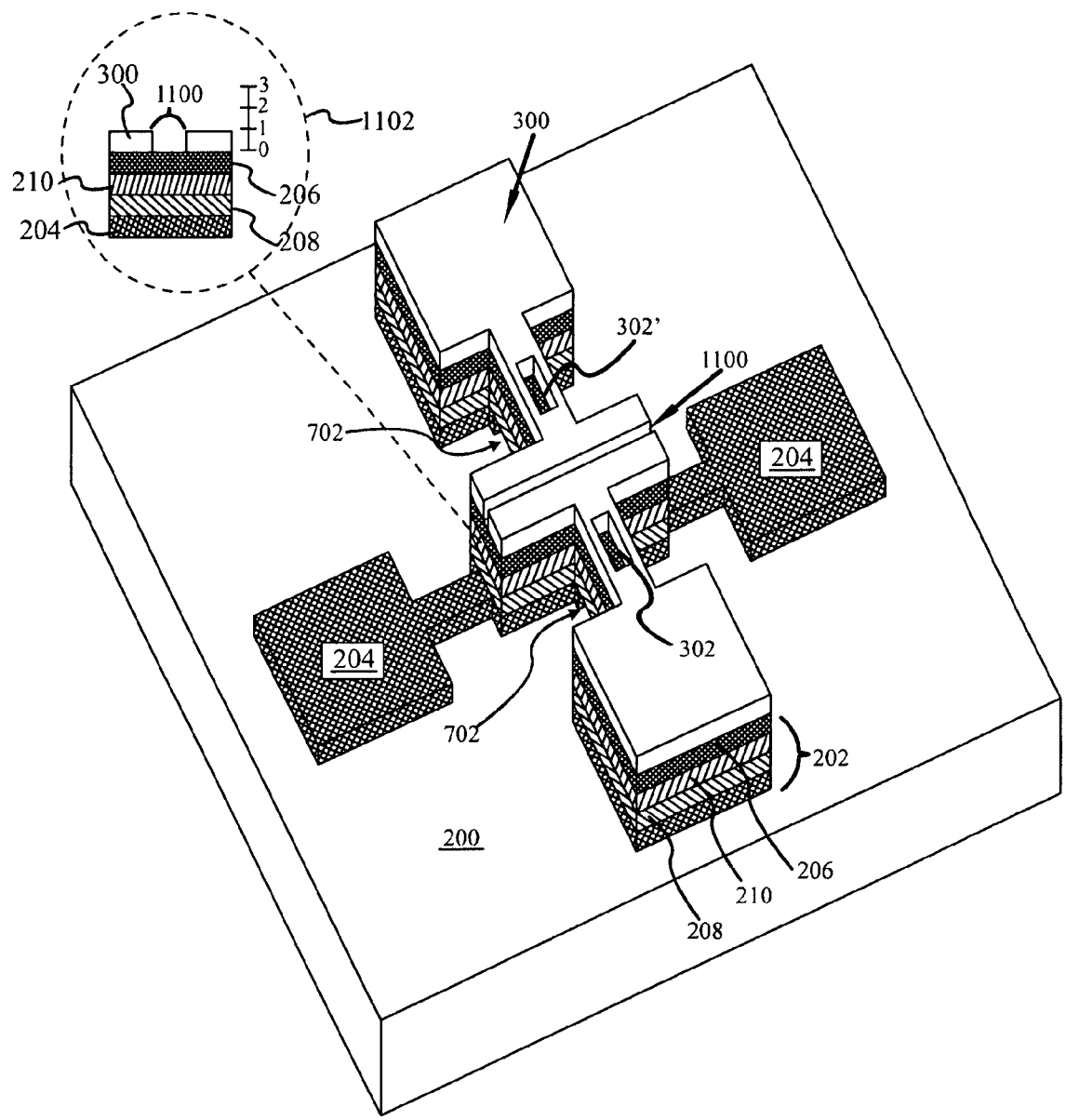
FIG. 11 is a perspective view of the structure in FIG. 10 with the 3D template having been etched to remove the thinnest layer and expose a portion of the top thin film layer in accordance with an embodiment.

The imprinted 3D template structure 300 is etched again to remove the lowest vertical height, now level 2. Etching through the lowest remaining vertical height exposes at least a portion of the stacked thin film layers 202. The remaining portions of 3D template structure 300 have also been reduced in height. A narrow channel 1100 (FIG. 11) in 3D template structure 300 now exposes second metal layer 206, as the exposed portion of the thin film layers 202. A cross section view bounded by dotted line 1102 in FIG. 11 illustrates the side view of the center structure and further illustrates the respective height levels (0, 1) of 3D template structure 300.

The second metal layer 206 as exposed through channel 1100 is now etched through to expose a sub layer. Specifically, in the embodiment shown, second metal layer 206 is etched through to expose a first sub layer disposed upon a second sub layer. The first and second sub layers are disposed between the top and bottom layers. This etching process is preferably highly anisotropic so that the exposed portion of second metal layer 206 is removed while portions of second metal layer 206 remaining beneath 3D template structure 300 remain substantially intact. In at least one embodiment, this is also aided by the fact that the thickness of the second metal layer 206 is about 1/10th the thickness of the thin metal regions adjacent to the aperture provided structure 302'.

Figure 12:
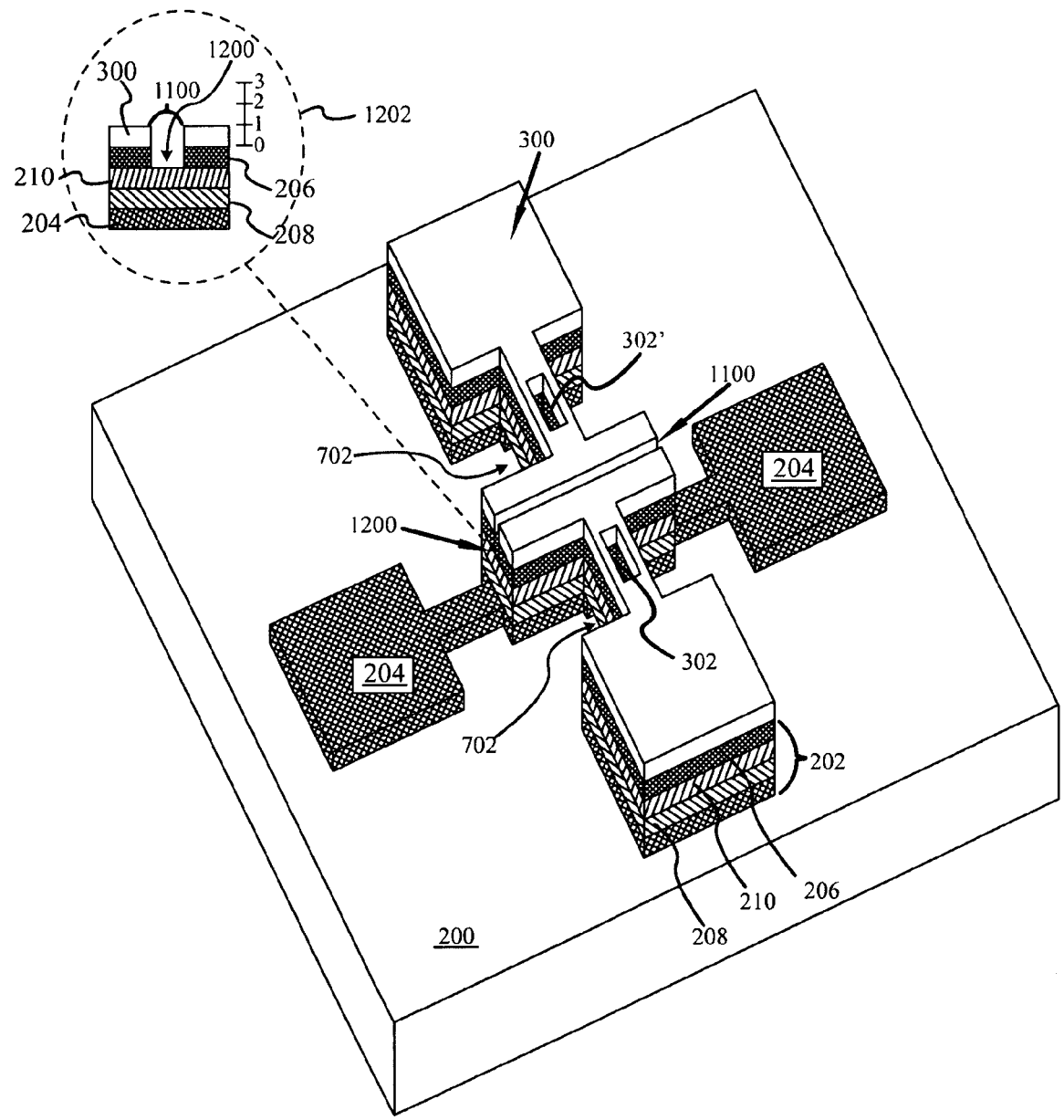
FIG. 12 is a perspective view of the structure in FIG. 11 with a channel now etched through the top exposed thin film layer in accordance with an embodiment.

In the embodiment shown in the figures, specifically FIG. 12, this exposed first sub layer is semiconductor 210 and the second sub layer is dielectric 208. This etching to expose semiconductor 210 establishes the channel 1200 for a transistor TFD. A cross section view bounded by dotted line 1202 illustrates the side view of the center structure and further illustrates the respective height levels (0, 1) of 3D template structure 300 and channel 1200.

Figure 13:
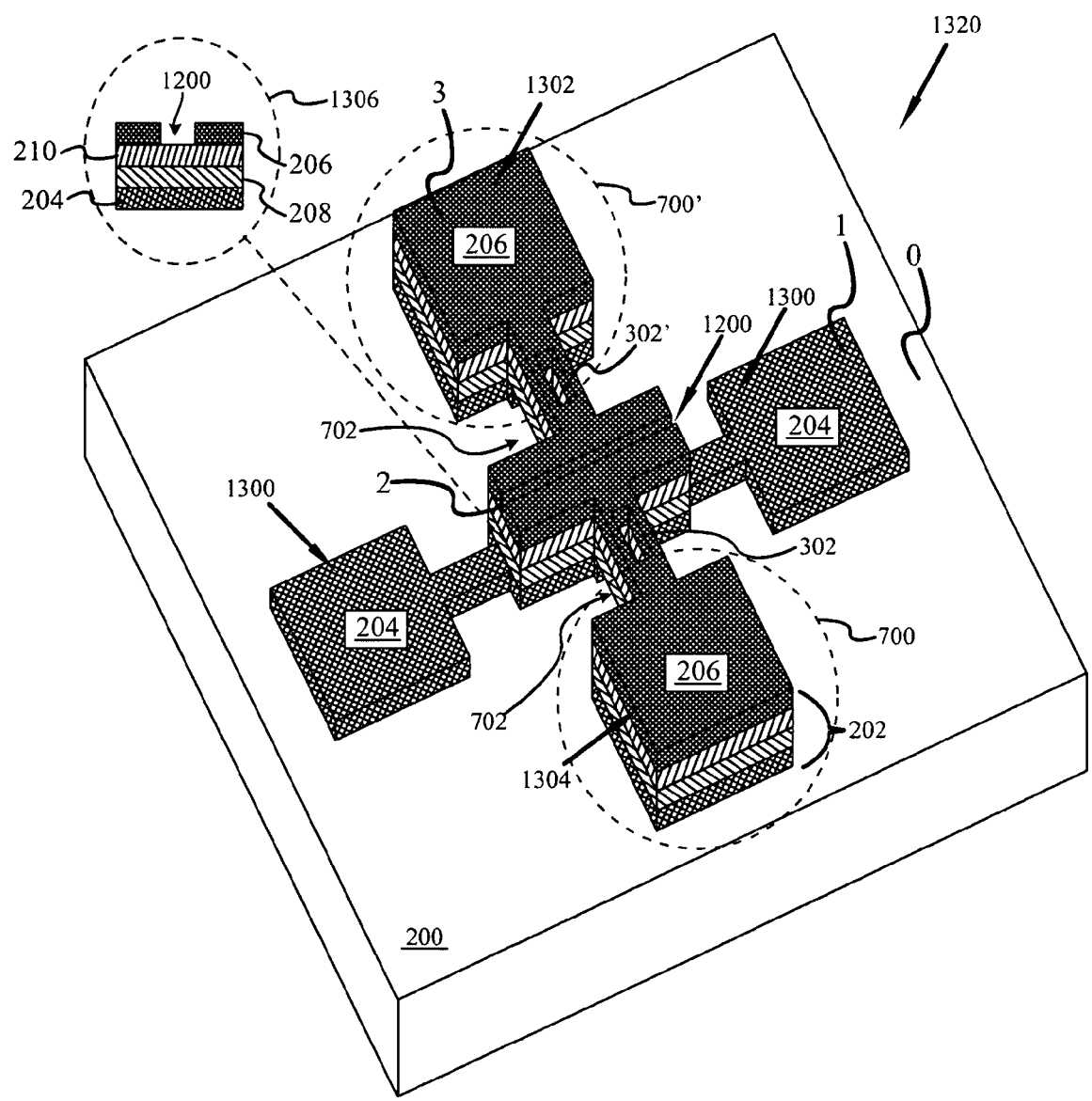
FIG. 13 is a perspective view of the structure in FIG. 12 with the remaining 3D template having been removed in accordance with an embodiment.

As shown in FIG. 13, the remaining portion of 3D template structure 300 has been etched through to expose the formed TFD. In the example provided, a bottom-gate TFT 1320 has been provided by the undercutting SAIL process. The first metal layer 204 provides gate contacts 1300, and second metal layer 206 provides source 1302 and drain 1304 contacts. More specifically, a bottom-gate TFT 1320 is a 3D contoured structure providing at least 4 substantially different vertical heights. The gate contacts 1300 are provided proximate to the substrate at the lowest height (level 0). The channel 1200 is provided proximate to the intermediate height (level 2). The source 1302 and drain 1304 are provided at the highest height (level 3). The source 1302 and drain 1304 are supported in part by simply connected regions that establish bridge islands 700, 700'.

TFT 1320 is a 3D structure with apertures through it. More specifically, gate contacts 1300 are separated from bridge islands 700, 700' (the support structures for source 1302 and drain 1304 by cut through 702, 700'. Features 302, 302 provide additional apertures in TFT 1320.

It may be further appreciated that had the 3D template level 2 not been provided to define channel 1200, the source 1302 to drain 1304 line provided by second metal layer 206 would not have been divided and the TFD would be a top to bottom metal crossover. The absence of 3D template structure 300 and the core of the fabricated transistor may be more fully appreciated in cross sectional view bounded by dotted line 1306.

Thus to form a transistor TFD, the 3D template structure 300 has 4 distinct vertical heights (0, 1, 2, 3). To provide a cross over device the 3D template structure 300 has 3 distinct vertical heights (0, 1, 2). Alleviating a need for additional heights, planarization and deposition, the above described method provides a simplified process of forming at least one TFD. In addition, the above described method may conserve materials and reduce waste and allow for the fabrication of bottom gate TFTs whose channel length can be nearly the minimum producible by the imprint process Although illustrated with respect to a single TFD, it will be understood and appreciated that the above described processes may be performed substantially simultaneously across a large substrate to provide an plurality of TFD devices, such as for example an array. As an array, the exposed source 1302 and drain 1304 contacts may be used as pixel electrodes in a display screen.

More specifically, a plurality of TFD's may be provided as an active matrix backplane for a display screen. In such embodiments, the TFD's control the display pixels (at least one TFD per pixel). It is understood and appreciated that with respect to the viewer the pixels may be in front of the backplane, and thus facing the viewer, or behind the transparent backplane, and thus shining through the backplane to reach the viewer.

With large pixels or small pixels, it is possible to achieve transparent or semi-transparent display screens via the use of Indium Tin Oxide, one of the known few transparent conductive materials. Other transparent conductive and semiconductor materials may also be used such as, for example ZnO as well as certain organic and doped semiconductor materials. Transparent dielectrics, such as, for example, SiN or $AL_2O_3$ may also be used.

Depending upon the thickness of the etched thin film layers 202 (the top and bottom conductors in materials therebetween), to some extent, TFDs made with common materials such as Al, Au, Cu, Si SiN, Cr, or the like may also be used to provide TFD's and matrix conductors of sufficiently small and thin size so as not to be visually obvious or intrusive. In other words the TFD's may be designed to have small enough thicknesses and small enough widths and intervening aperture spacing between components that they are either nearly transparent and/or the loss of light due to absorption is minimal.

Moreover, a transparent thin film device may be provided by utilizing transparent materials; by providing devices of such minute scale and with intervening aperture spacing; or by combining both transparent materials with a minute scale. The ability to provide a matrix of high quality TFD's as transparent or semi-transparent backplane. displays may be highly desirable in the fabrication of video displays. For example, heads up displays as might be used to display navigation information on the windshield of a vehicle (car, aircraft, submarine, etc . . . ) may be advantageously easily fabricated.

Changes may be made in the above methods, systems and structures without departing from the scope thereof. It should thus be noted that the matter contained in the above description and/or shown in the accompanying drawings should be interpreted as illustrative and not in a limiting sense. The following claims address all generic and specific features described herein, as well as all statements of the scope of the present method, system and structure, which, as a matter of language, might be said to fall therebetween.

What is claimed is:

1. A method of forming at least one thin film device comprising:
   providing a substrate;
   depositing a plurality of thin film device layers upon the substrate;
   providing a 3D template structure upon the plurality of thin film device layers, the 3D template providing all patterning and alignment for all subsequent etching and undercutting;
   etching the plurality of thin film device layers and 3D template structure; and
   undercutting at least one thin film device layer.

2. The method of claim 1, wherein the substrate is suitable for roll-to-roll processing.

3. The method of claim 1, wherein providing the 3D template is a single polymer imprinting process.

4. The method of claim 1, wherein the undercutting provides a plurality of simply connected regions in at least one thin film device layer adjacent to a single simply connected region in a different thin film device layer.

5. The method of claim 4, wherein the 3D template provides at least one feature to promote the plurality of simply connected regions in at least one thin film device layer.

6. The method of claim 4, wherein the plurality of simply connected regions are beneath a single simply connected region in a different layer.

7. The method of claim 1, wherein the undercutting provides a released structure adjacent to non-released structures.

8. The method of claim 1, wherein the thin film device is a microelectromechanical system device.

9. The method of claim 1, wherein to form a transistor device, the 3D template has 3 different vertical heights.

10. The method of claim 1, wherein to form a cross over device, the 3D template has 2 different vertical heights.

11. The method of claim 1, wherein a planarization material is not employed.

12. The method of claim 1, wherein all thin film device layers are deposited before etching is performed.

13. The method of claim 1, wherein the thin film device layers include a first metal layer and a second metal layer with at least one material layer therebetween.

14. The method of claim 13, wherein the first metal comprises Aluminum and the second metal comprises Chrome.

15. The method of claim 1, wherein the method provides a plurality of thin film devices in an array as an active matrix backplane.

16. The method of claim 1, wherein the substrate is transparent.

17. The method of claim 1, wherein the at least one thin film device layer is transparent.

18. A method of forming at least one thin film device comprising:
   providing a flexible substrate;
   depositing a plurality of thin film device layers upon the flexible substrate;
   depositing an imprint polymer upon the plurality of thin film device layers;
   forming a 3D template in the imprint polymer, the 3D template masking at least a portion of the thin film device layers; the 3D template having a plurality of different vertical heights;
   etching unmasked portions of the thin film device layers thereby exposing at least a portion of the substrate; and
   undercutting at least one thin film device layer thereby providing at least one bridged island.

19. The method of claim 18, wherein the undercutting of at least one thin film device layer is accomplished by wet or dry isotropic etching.

20. The method of claim 18, wherein the undercutting provides a plurality of simply connected regions in at least one thin film device layer adjacent to a single simply connected region in a different thin film device layer.

21. The method of claim 20, wherein the 3D template provides at least one feature to promote the plurality of simply connected regions in at least one thin film device layer.

22. The method of claim 18, wherein to form a transistor device, the 3D template has 3 different vertical heights.

23. The method of claim 18, wherein to form a cross over device, the 3D template has 2 different vertical heights.

24. The method of claim 18, wherein the thin film device layers comprise a first metal, a gate dielectric, a channel semiconductor, a second metal.

25. The method of claim 18, wherein the thin film device layers comprise layers of Aluminum, Silicon Nitride, Amorphous Silicon, N+ doped microcrystalline or amorphous Silicon, Titanium.

26. The method of claim 18, wherein the thin film device layers comprise layers of Titanium, Alumina, Zinc Oxide, Aluminum.

27. The method of claim 18, wherein at least one layer of the thin film device layers consists of a plurality of layers.

28. The method of claim 18, wherein the method is performed as a roll-to-roll process.

29. A method of forming at least one thin film device comprising:
   providing a substrate;
   depositing a plurality of stacked thin film device layers upon the substrate, the stack including a bottom layer and a top layer;
   depositing an imprint polymer upon the plurality of thin film device layers;
   forming a 3D template in the imprint polymer, the 3D template masking at least a portion of the thin film device layers; the 3D template having a plurality of different vertical heights;
   etching unmasked portions of the thin film device layers thereby exposing at least a portion of the substrate;
   undercutting the bottom layer thereby providing at least one bridge island;

etching through the lowest vertical height thereby exposing at least a portion of the thin film layers;

etching the exposed portion of the thin film layers thereby exposing the bottom layer; and etching through the remaining lowest vertical height, thereby exposing at least a portion of the top layer.

30. The method of claim 29, wherein the 3D template is a single polymer imprinting process, the single process providing all patterning and alignment for all subsequent etching and undercutting.

31. The method of claim 29, wherein the substrate is suitable for roll-to-roll processing.

32. The method of claim 29, wherein the substrate is flexible plastic.

33. The method of claim 29, wherein the at least one thin film device is transparent.

34. The method of claim 29, wherein to form a transistor device, the 3D template has 3 different vertical heights.

35. The method of claim 34, further including etching through the exposed portion of the top layer thereby exposing a first sub layer deposited upon a second sub layer, the first and second sub layers deposited between the top and bottom layers.

36. The method of claim 35, wherein the thin film device is a transistor, the first sub layer providing the channel.

37. The method of claim 35, wherein the bottom layer is a first metal, the top layer is a second metal, the first sub layer is a semiconductor and the second sub layer is a dielectric.

38. A method of forming at least one thin film device comprising:

providing a substrate;

depositing a plurality of stacked thin film device layers upon the substrate, the stack including a bottom layer and a top layer;

depositing an imprint polymer upon the plurality of thin film device layers;

forming a 3D template in the imprint polymer, the 3D template masking at least a portion of the thin film device layers; the 3D template having two different vertical heights;

etching unmasked portions of the thin film device layers thereby exposing at least a portion of the substrate, the 3D template providing at least one feature to promote a plurality of simply connected regions in the bottom layer;

undercutting the bottom layer thereby providing a plurality of simply connected regions beneath a single simply connected region of an adjacent thin film device layer;

etching through the lowest vertical height of the 3D template thereby exposing at least a portion of the thin film layers;

etching the exposed portion of the thin film layers thereby exposing the bottom layer; and etching through the remaining lowest vertical height of the 3D template, thereby exposing at least a portion of the top layer.

39. The method of claim 38, wherein at least one layer of the thin film device layers consists of a plurality of layers.

40. A method of forming at least one thin film device comprising:

providing a substrate;

depositing a plurality of stacked thin film device layers upon the substrate, the stack including a bottom layer and a top layer;

depositing an imprint polymer upon the plurality of thin film device layers;

forming a 3D template in the imprint polymer, the 3D template masking at least a portion of the thin film device layers; the 3D template having three different vertical heights;

etching unmasked portions of the thin film device layers thereby exposing at least a portion of the substrate, the 3D template providing at least one feature to promote a plurality of simply connected regions in the bottom layer;

undercutting the bottom layer thereby providing a plurality of simply connected regions beneath a single simply connected region of an adjacent thin film device layer;

etching through the lowest vertical height of the 3D template thereby exposing at least a portion of the thin film layers;

etching the exposed portion of the thin film layers thereby exposing the bottom layer;

etching through the next lowest vertical height of the 3D template, thereby exposing at least a portion of the top layer; and etching through the exposed portion of the top layer thereby exposing a first sub layer, the first sub layer deposited between the top and bottom layers.

41. The method of claim 40, wherein the bottom layer is a first metal, the top layer is a second metal, the first sub layer is a semiconductor and a second sub layer is a dielectric.

42. The method of claim 40, wherein at least one layer of the thin film device layers consists of a plurality of layers.

43. The method of claim 40, wherein the at least one thin film device is transparent.

* * * * *